United States Patent [19]

Hofmann

[11] Patent Number: 4,897,645
[45] Date of Patent: Jan. 30, 1990

[54] BROADBAND SIGNAL SWITCHING EQUIPMENT

[75] Inventor: Ruediger Hofmann, Gilching, Fed. Rep. of Germany

[73] Assignee: Siemens Aktiengesellschaft, Berlin and Munich, Fed. Rep. of Germany

[21] Appl. No.: 103,909

[22] Filed: Oct. 2, 1987

[30] Foreign Application Priority Data

Oct. 7, 1986 [DE] Fed. Rep. of Germany ....... 3634154

[51] Int. Cl.$^4$ ............................................. H04Q 1/00
[52] U.S. Cl. ...................... 340/825.910; 340/825.800; 307/468
[58] Field of Search ......... 340/825.79, 825.85-825.91, 340/825.93; 379/292, 306; 307/465, 468, 469, 241, 530; 370/58; 365/190, 200, 203, 207

[56] References Cited

U.S. PATENT DOCUMENTS

| | | | |
|---|---|---|---|
| 3,789,151 | 1/1974 | Richards | 340/825.9 |
| 3,980,831 | 9/1976 | Mertel | 179/2 R |
| 4,060,699 | 11/1977 | Ataka et al. | 340/825.93 |
| 4,247,791 | 1/1981 | Rovell | 365/190 |
| 4,379,345 | 4/1983 | Url | 365/208 |
| 4,386,419 | 5/1983 | Yamamoto | 365/190 |
| 4,443,773 | 4/1984 | Rall et al. | 340/825.93 |
| 4,446,552 | 5/1984 | Tweedy | 370/58 |
| 4,801,936 | 1/1989 | Hofmann | 340/825.91 |

OTHER PUBLICATIONS

Sunazawa, et al., "Wideband Integrated Crosspoint Switch Matrix", Review of the Electrical Communication Laboratories, vol. 25, Nos. 1-2, Jan.-Feb., 1977, pp. 43-51.

Bauch et al., "Architectural... Switching", 155'84 Conference Papers, Session 23 C, Paper 1, May 1984, pp. 1-7.

Stein et al., "A 1-mil$^2$... Silicon Gate Technology", IEEE J. of Solid-State Circuits, vol. SC-8, No. 5, Oct. 1973, pp. 319-323.

Schomers, J., "Digitales . . . Koppelmatrix," Fernseh-und kino-Technik, vol. 38, No. 3, Apr. 1984, pp. 137-143.

Pfannschmidt, H., "Arbeitsgeschwindiqkeitsgrenzen... Digitalsignale," Univ. Carolo-Wilhelmina, Braunschweig, 16 Mar.-29 Jun., 1978, pp. 120-125.

Kunze, A. "Tides: A New Concept in Time Division Electronic Switching", Communications presentees au Colloque International de Communication, Electronique, Paris, Mar. 28-Apr. 2, 1966, Editions Chiron, pp. 301-312, FIGS. 4 & 5.

*Primary Examiner*—Donald J. Yusko
*Assistant Examiner*—Edwin C. Holloway, III
*Attorney, Agent, or Firm*—Hill, Van Santen, Steadman & Simpson

[57] ABSTRACT

In a crosspoint matrix, column lines are formed by two signal conductors connected to difference outputs of differential line drivers which are connected by switch element pairs of transistors to row lines, the row lines also each formed by two signal conductors. The two signal conductors of each row line are respectively connected to two outputs of a differential amplifier operating in a trigger mode. Each of the switch elements, includes a switching transistor having its control electrode charged with a through-connect or an inhibit signal and having its main electrode connected to an matrix output line and an auxiliary transistor forming a series circuit with the switching transistor. The auxiliary transistor has its control electrode connected to a matrix input line and its main electrode connected away from the series circuit connected to ground by a sampling transistor. The matrix output conductor is connected to an operating potential by way of a precharging transistor. Precharging and sampling transistors are oppositely driven with a switching matrix network selection clock which sub-divides a bit through-connect time interval into a precharging phase and an actual through-connect phase.

7 Claims, 4 Drawing Sheets

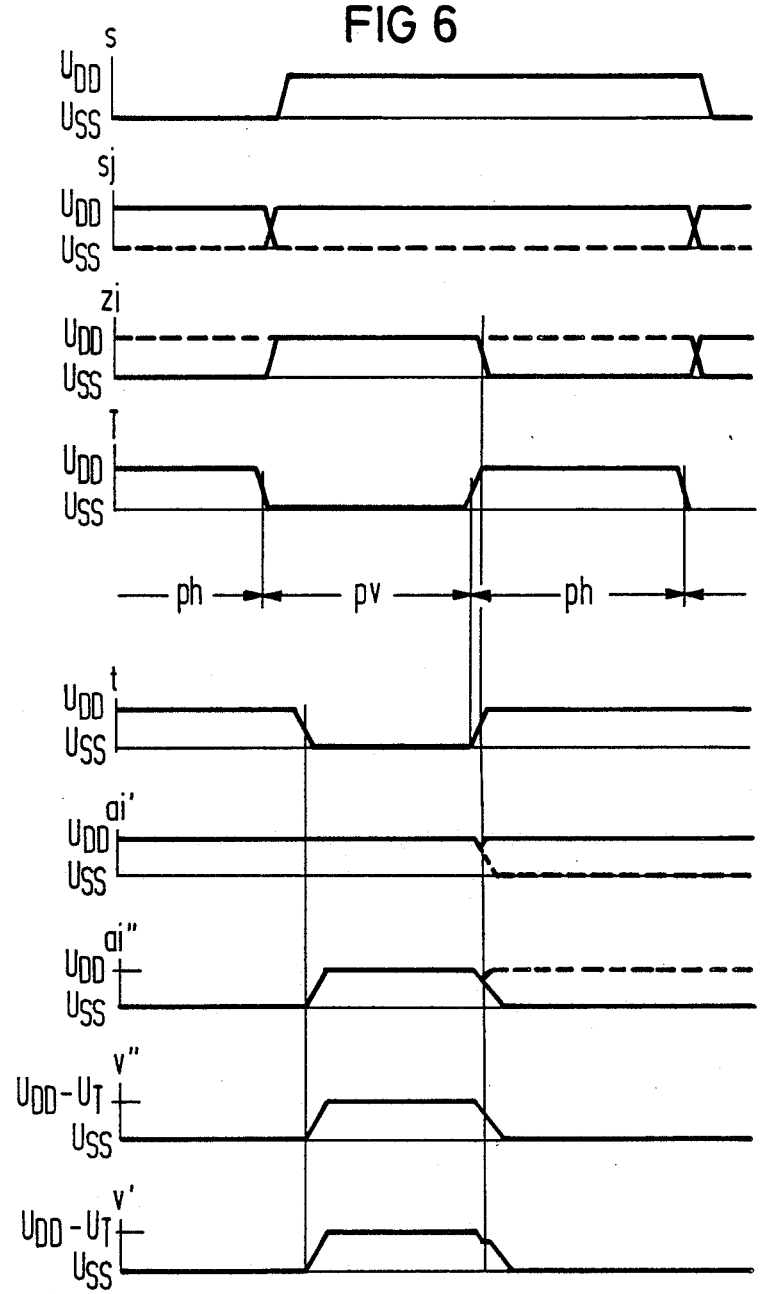

BROADBAND SIGNAL SWITCHING EQUIPMENT

BACKGROUND OF THE INVENTION

1. Field of the Invention

The present invention relates to broadband signal switching equipment comprising a crosspoint matrix which, in turn, comprises matrix input lines, each formed with two signal conductors, the matrix input lines being respectively connected, first of all, two different complementary outputs of an input digital signal circuit and, secondly, being connectible by way of crosspoints to matrix output lines which are each likewise formed with two signal conductors which lead to two signal inputs of an output amplifier circuit formed with a differential amplifier.

2. Description of the Prior Art

Recent developments in telecommunications technology have led to integrated services communications transmission and switching systems for narrow band and broadband communication services which provide light waveguides as transmission media in the region of the subscriber lines, both narrow band communication services such as, in particular, 64 kbit/s digital telephony, and broadband communication services such as, in particular, 140 Mbit/s picture telephony being conducted thereover, whereby narrow band signal switching equipment are provided side-by-side in the exchanges (preferably comprising shared-controlled devices as in the German Pat. No. 24 21 002).

In conjunction with a broadband signal time-division multiplex switching system whose crosspoints are utilized in time-division multiplex for a respective polarity of connections, it is known to connect respectively two lines with the assistance of a gate circuit that is switched on and off by a crosspoint-associated memory cell formed as a bistable D flip-flop, whereby this crosspoint-associated memory cell whose clock input is supplied with an appropriate clock signal is driven in only one coordinate direction, namely at its D input (Pfanneschmidt, "Arbeitsgeschwindigkeitsgrenzen von Koppelnetzwerken fur Breitband-Digitalsignale", Dissertation Braunschweig 1978, FIG. 6.7, FIG. 6.4). In view of a time-division multiplex factor of about 4–8 obtainable given a bit rate of 140 Mbit/s and of the involved circuit technology thereby required, however, fewer space-division switching equipment are currently preferred for switching broadband signals, the connections through-connected via the individual crosspoints being separated from one another therein in only spatial terms.

A pure broadband signal space coupling arrangement can be fashioned as a crosspoint matrix in CMOS technology provided with input amplifiers and output amplifiers in whose crosspoints the switch elements are respectively controlled by a decoder-controlled, crosspoint-associated holding memory cell, whereby the switch elements are each fashioned as a CMOS transfer gate (CMOS transmission gate) (ISS 84 Conference Papers 23 Cl, FIG. 9); the crosspoint-associated holding memory elements of a pure space switching multiple can be selected in two coordinates proceeding from a row decoder and from a column decoder, being respectively selected via a row-associated or, respectively, column-associated selection line (Pfannschmidt, op. cit. FIG. 6.4). Inversely, however, it is also possible to integrate crosspoint-associated address decoder elements (logic elements) into the crosspoint matrix itself, whereby these address decoder elements are charged with crosspoint addresses proceeding from external address registers, i.e. from address registers arranged outside of the actual crosspoint matrix (see, for example, Kunze, "TIDES: A NEW CONCEPT IN TIME DIVISION ELECTRONIC SWITCHING", Communications presentees au Colloque INTERNATIONAL de COMMUNICATION ELECTRONIQUE, Paris, 1966, EDITIONS CHIRON, pp. 301–312, FIG. 4 and FIG. 5).

A broadband signal switching equipment comprising a crosspoint matrix in ECL technology is also known (from FERNSEH UND KINO-TECHNIK, Vol. 38, No. 4, 1984, pp. 137–143, FIGS. 3–5), this crosspoint matrix respectively comprising matrix input lines formed with two signal conductors, the matrix input lines being connected, first of all, to respectively two complimentary outputs of a row input amplifier and, secondly, being connectable by way of crosspoints to matrix output lines likewise respectively formed with two signal conductors which respectively lead to the two signal inputs of a column output amplifier formed by a differential amplifier. The crosspoints are thereby constructed in a bipolar current switch technology (also referred to CML current mode logic) in accordance wherewith a current supplied by a current source switchable by a through-connection or, respectively, inhibit signal, is switched into the one or the other branch of a differential amplifier formed with two emitter-coupled transistors, being switched thereinto based on the measure of the matrix input signal. Disturbing signals which can proceed to the output in the inhibited condition of such a crosspoint by way of a depletion layer capacitance of the collector-base diodes are thereby to be attenuated by a neutralization circuit requiring two additional transistors having exactly the same dimensions.

SUMMARY OF THE INVENTION

If ECL technology can be characterized by properties such as high working speed, (moderately) high degree of integration and (moderately) high dissipated power, then the FET technology, given, however, only moderate working speeds in comparison thereto, can be characterized by an extremely high degree of integration and by a very low dissipated power. These latter properties have led to the efforts to advance into speed ranges with integrated circuits in FET technology which were herefor reserved for bipolar technology. The object of the invention, then, is to disclose a way toward a broadband signal switching equipment having an especially high working speed which avoids the ECL technology given a high capability of integration and low dissipated power at the same time.

The object of the present invention, therefore, is to provide a method towards a broadband signal switching equipment having a particularly high working speed which avoids the ECL technology, given a high capacity of integration and low dissipative power at the same time.

The present invention is directed to a broadband signal switching equipment in the form of a crosspoint matrix having respective matrix input lines each formed with two signal conductors, the two signal conductors of each matrix input lines being respectively connected, first of all to two difference (complementary) outputs of an input digital signal line and being connectable via crosspoints to matrix output lines also each formed with two signal conductors. The matrix output lines each have both signal conductors respectively fed to the two signal inputs of an output amplifier circuit formed with a differential amplifier. This broadband signal switching equipment is particularly characterized by a crosspoint matrix constructed in FET technology and comprising switch element pairs provided in the crosspoints and each constructed with two switching transistors respectively charged at their control electrodes with a through-connect or an, inhibit signal. The switching transistors of these switching element pairs respectively having a primary electrode connected to one signal conductor of the associated matrix output line which is, in turn, provided with an output differential amplifier operable in a trigger mode.

In addition to the advantages that are involved with keeping a crosspoint matrix in FET technology, the invention provides the advantages that, first of all, given an inhibited crosspoint, no disturbing signals proceed by way of the crosspoint to the matrix output even without additional attenuation measures and that, secondly, given a transmissive crosspoint, and given a charge reversal of the matrix output line potentially occurring at the bit through-connection, and unambiguous transition of the through-connected digital signal appearing at the output of the switching equipment from the one into the other signal state is already involved with a small charge reversal, corresponding to the upward transgression of a threshold adjacent to the trigger point of the differential amplifier, and is therefore correspondingly fast.

A corresponding, further increase in the working speed of the broadband signal switching equipment is obtained when, in accordance with the further feature of the invention, the switch element pairs each comprise two auxiliary transistors each preceding, and having a controlled path forming, a series circuit with a switching transistor each auxiliary transistor has its control electrode connected to signal conductor of the associated matrix input line and a primary electrode at a side of the controlled path away from the series circuit connected by a sampling transistor to one terminal (ground) of the operating voltage source the other terminal of the operating voltage source is connected to each signal conductor of the respective matrix output line by way of a pre-charging transistor. The pre-charging transistors and sampling transistors respectively have their control electrode oppositely charged with a switching matrix network clock which subdivides a bit through-connection time interval into a pre-charging phase and into an actual through-connect phase, so that, in each pre-charging phase, given an inhibited sampling transistor, both signal conductors of the matrix output line are at least approximately charged by the respective pre-charging transistor to the potential prevailing at the other terminal of the operating voltage source. This provides the advantage that the charge reversals of the matrix output line potentially occuring in the actual bit through-connection, and always proceding from one operating potential corresponding to one signal state, proceed only in one charge reversal direction and, therefore, provides an unambiguous transition of the through-connected digital signal from the one signal state into the opposite signal state with a small charge reversal (corresponding to the upward transgression of a threshold adjacent to this value of operating potential). The transition is therefore correspondingly fast.

Given a realization of the crosspoint matrix in CMOS technology, the working speed, in comparison to crosspoint matrices whose switch elements are formed with CMOS transfer gates and/or CMOS inverters, is further increased when, in accordance with a further feature of the invention, the switching transistors, auxiliary transistors and sampling transistors are n-channel transistors and at most the pre-charging transistors are p-channel transistors. The p-channel transistors, which require a larger area because of their higher specific resistance, are therefore, at most, to be provided only associated to the matrix output lines, but not crosspoint-associated. This is particularly important in integration, because the crosspoint matrix can be realized with appropriately low space requirement, and with approximately low switching capacitances. Since the dissipated power of the crosspoint matrix is primarily the charging power to be exerted on the matrix lines, the overall power consumption, given reduced capacitive loading of the matrix output lines, is also reduced in addition to the charge reversal times.

BRIEF DESCRIPTION OF THE DRAWINGS

Other objects, features and advantages of the invention, its organization, construction and operation, will be best understood from the following detailed description, taken in conjunction with the accompanying drawings, on which:

FIG. 6 is a graphic illustration of, in the form of a pulse chart, showing signal curves which appear in the broadband switching equipment of FIG. 1.

BRIEF DESCRIPTION OF THE PREFERRED EMBODIMENTS

Figure 1:
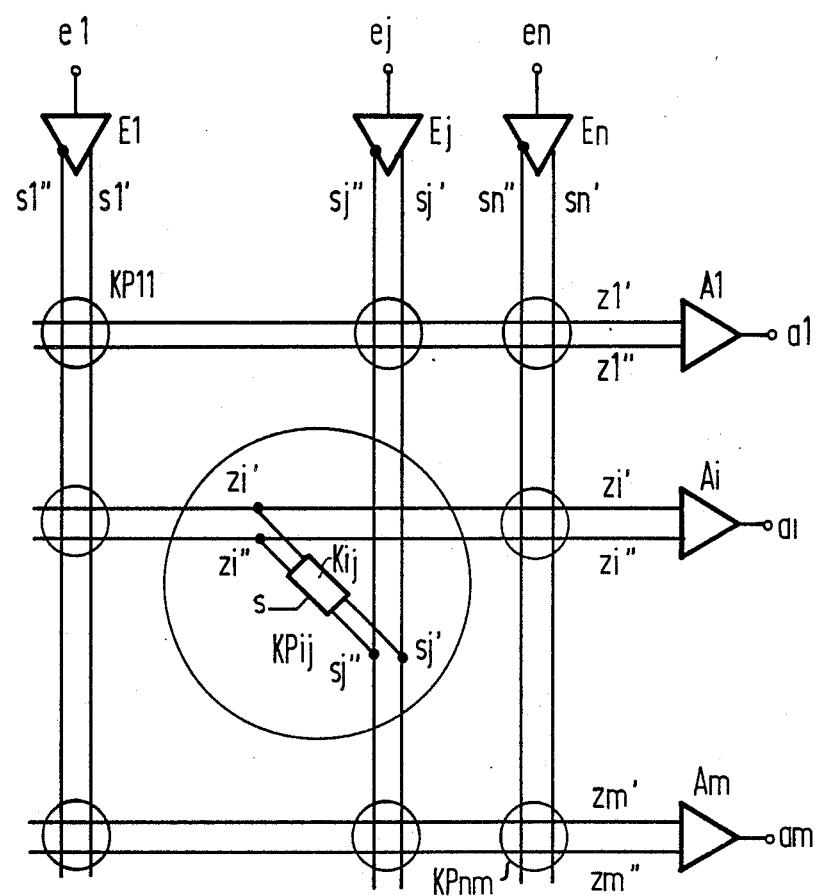
FIG. 1 is a schematic representation of a broadband switching equipment construction in accordance with the present invention.

Referring to FIG. 1, the drawing schematically illustrates a broadband signal switching matrix to a degree necessary for understanding the present invention. Input digital signal circuits El . . . Ej . . . En are provided at the inputs el . . . ej . . . en of a crosspoint matrix leading to a plurality of column lines Sl . . . Sj . . . Sn of the crosspoint matrix. The outputs al . . . ai . . . am of the matrix are connected to row lines zl . . . zi . . . zm of the crosspoints via output amplifier circuits Al . . . Ai . . . Am. The crosspoint matrix comprises crosspoints KPll . . . KPij . . . KPmn whose switch elements, indicated in further detail in the case of crosspoint KPij for a switch element pair Kij, can be respectively controlled at a control input s by an address decoder element or holding memory element (these not being shown in detail in the drawing. Such control of the switch elements is well-known in the art and appropriate explanations, moreover, may be found elsewhere, such as in the German Pat. No. 36 31 634.2.

The matrix input lines (column lines) are each formed with two signal conductors sl′, sl″. . . sj′, sj″. . . sn′, sn″ which are respectively connected to complementary (difference) outputs of the respectively associated input digital signal circuit El . . . Ej . . . En illustrated in FIG. 1 as respective amplifiers each having a non-inverting and an inverting output, known as a differential line driver. The matrix input lines (column lines) sl', sl''... sj', sj''... sn', sn'' proceeding from the complementary outputs of the input digital signal circuits El... Ej... En in this fashion are connected to matrix output lines (row lines) via the crosspoints KPll... KPij... KPnm constructed with switch element pairs (Kij in the case of the crosspoint KPij in FIG. 1). Each of these matrix output lines is likewise constructed with two signal conductors zl', zl''... zi', zi''... zm', zm'' respectively leading to the two signal inputs of an output amplifier circuit Al... Ai... Am... formed with a differential amplifier operable in a trigger mode.

Figure 3:
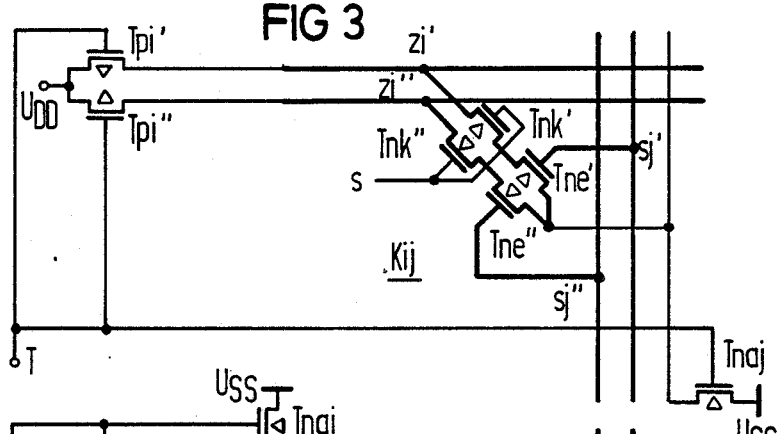
Figure 5:
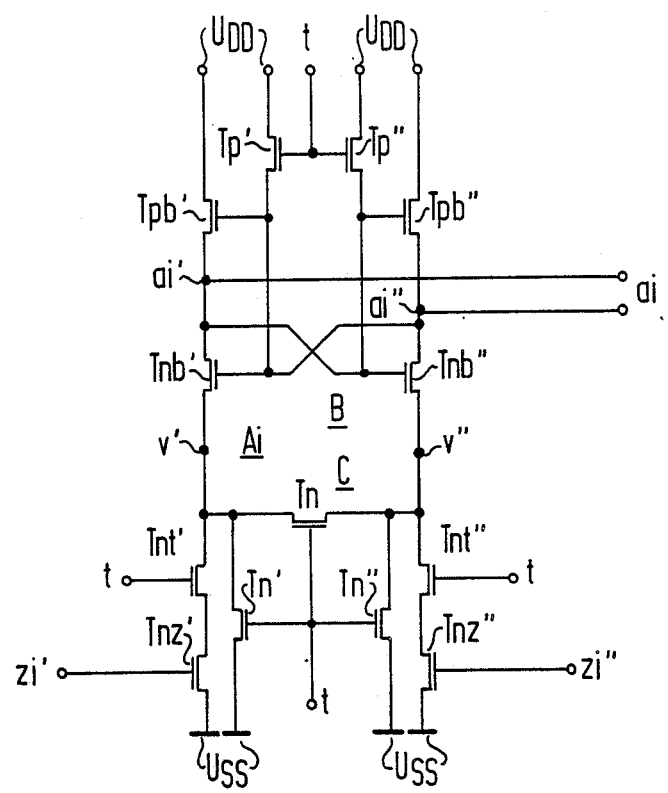
FIG. 5 is a schematic representation of a differential amplifier operable in a trigger mode.

Such a differential amplifier operable in a trigger mode can be a gated flip-flop, as is basically known (IEEE Journal of Solid-State Circuits, Oct. 1973, pp. 319-323, FIG. 6) and as likewise already known in various modifications (for example, from the German published application 24 22 136, FIG. 3, 16' and from the German published application 26 08 119, FIG. 5).

In the exemplary embodiment of FIG. 5, the differential amplifier operable in a trigger mode in such an output amplifier circuit Al... Ai... Am comprises a bistable trigger element B, not constantly activated as such, having two cross-coupled CMOS inverter circuits Tpb', Tnb'; Tpb'', Tnb'', to whose two outputs ai' and ai'' one feed potential source $U_{DD}$ can also be simultaneously connected via two isodirectional clock signal control switching transistors Tp' and Tp'' of a first channel type, such as a p-channel (depletion) transistor in the exemplary embodiment. A selection circuit C is connected between the two transistors Tnb' and Tnb'' of a second channel type, such as channel (enhancement) transistors in the exemplary embodiment, and the other feed potential source $U_{SS}$. The selection circuit C includes two further transistors Tn', Tn'' of the same type between the transistors Tnb', Tnb'' and the feed potential source $U_{SS}$, and two series circuits connected parallel to these two further transistors Tn', Tn''. These series circuits each consist of a MOS transistor Tnz' or, Tnz'' of the same type respectively controlled with the input signal or with the negated input signal of the clock signal controlled MOS transistor Tnt' or Tnt'' of the same type. A transistor Tn of the same type, which can interconnect the two cross-coupled CMOS inverter circuits to form the bistable trigger element is inserted between the two junctions v', v'' of the two cross-coupled CMOS inverter circuit Tpb', Tnb' and Tpb'', Tnb'', and the symetrically dimensioned selection circuit C. As an example, it is assumed that the operating voltage terminals $U_{DD}$ of the differential amplifier, operable in a trigger mode illustrated in FIG. 5, are supplied with a feed potential of, for example, +5 volts in comparison to the potential established at the operating voltage terminals $U_{SS}$ (ground).

Before the operation of the differential amplifier operable in a trigger mode, as shown in FIG. 5, is set forth below, the switch element pairs Kij will be discussed.

Figure 2:
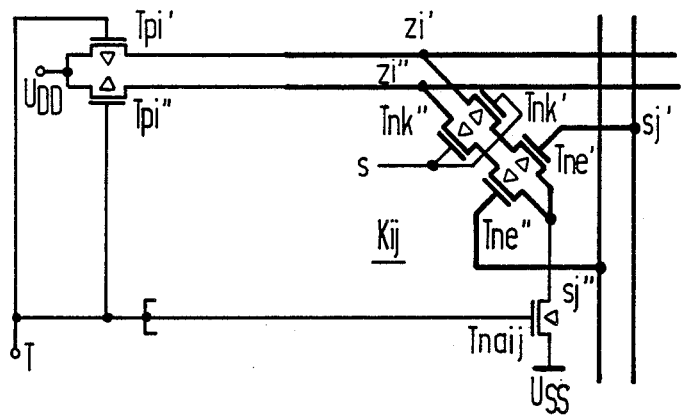
FIGS. 2, 3 and 4 illustrate, in schematic form, exemplary embodiments of the circuit-associated realization of the switch elements of the broadband switching equipment.
Figure 4:
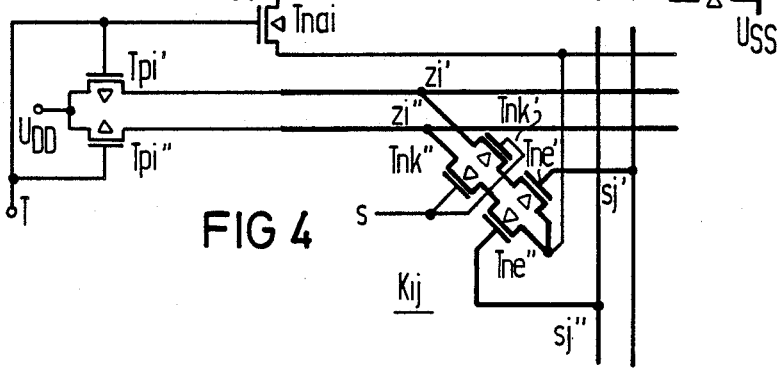

Referring to FIG. 2, FIG. 3 and FIG. 4, different exemplary circuits are illustrated for the switch element pairs Kij. The switch element pairs Kij are each constructed with two switching transistors Tnk', Tnk'' having their respective control electrodes charged with a through-connect or, an inhibit signal the switching transistors also have one primary electrode connected to the one or the other signal conductor zi', zi'' of the associated matrix output line each switch element pair also includes two auxiliary transistors Tne' and Tne'' respectively forming a series circuit with a switching transistor Tnk' or Tnk''. The control electrode of the transistors Tne' and Tne'' are respectively connected to one signal conductor sj' or to the other signal conductor sj'' of the associated matrix input line (column line) sj, and each has a primary electrode facing away from the series circuit connected by a sampling transistor Tna (namely, Tnaij in FIG. 2 or, respectively, Tnaj in FIG. 3 or, respectively, Tnai in FIG. 4) to one terminal $U_{SS}$ (ground) of the operating voltage source. The two signal conductors zi', zi'' of the matrix output line (row line) zi are respectively connected to the other terminal $U_{DD}$ of the operating voltage source via a pre-charge transistor Tpi' or Tpi''.

As also illustrated in FIG. 2, a sampling transistor Tnaij associated to a switch element pair can also be provided. Alternatively as shown in FIG. 3, a sampling transistor Tnaj shared by all switch element pairs lying at one and the same matrix input line (column line) sj and, therefore, associated to the matrix input line can be provided another alternative is shown in FIG. 4, wherein a sampling transistor Tnai shared by all switch element pairs lying at one and the same matrix output line (row line) zi and, therefore, associated to the matrix output line can be provided.

As likewise indicated in FIGS. 2-4, the switching transistors Tnk, the auxiliary transistors Tne and the sampling transistors Tna can be n-channel transistors, when the crosspoint matrix is constructed in CMOS technology, and the pre-charging transistors Tpi can be p-channel transistors. The control electrodes of the pre-charging transistors Tpi and the sampling transistors Tna are respectively oppositely charged with a clock T indicated in the line T in FIG. 6 which subdivides a bit through-connect time interval into a preliminary phase pv and a main phase ph as indicated in FIG. 6, center.

During the preliminary phase pv (with reference to the center of FIG. 6), the two signal conductors zi', zi'' of the matrix output lines (row lines) zi are respectively charged at least approximately to the operating potential of $U_{DD}$ via the respective pre-charging transistor (Tpi' or Tpi'' in FIGS. 2-4). The pre-charging transistors Tpi', Tpi'' are rendered transmissive by a "low" clock signal T (FIG. 6, line T). At the same time, the sampling transistors Tna (Tnaj in FIG. 2, Tnaj in FIG. 3, Tnai in FIG. 4) formed by n-channel transistors are driven in the opposite sense, i.e. inhibited, by the same "low" clock signal T in the example, so that the charging of the respective two signal conductors (zi', zi'') of the matrix output lines (row lines) zi can proceed independently of the selection of the respective switching transistors Tnk', Tnk'' (in FIGS. 2-4) and independently of the respective pre-switch transistors Tne', Tne'' (in FIG. 2-4) of the individual switch element pairs Kij. The potential corresponding to the respective bit to be through-connected may already build up (or be retained) on the respective matrix input line (column line) sj as illustrated in line sj in FIG. 6.

In the following main phase ph (with reference to the center of FIG. 6), the pre-charging transistors Tpi', Tpi'' (in FIGS. 2-4) are inhibited by a "high" clock signal T shown in line T of FIG. 6 in the example and the sampling transistors Tna, (Tnaij in FIG. 2, Tnaj in FIG. 3, Tnai in FIG. 4) are unblocked at the same time. The switching transistors Tnk', Tnk'' (FIGS. 2-4, represented by n-channel transistors) of a switch element pair Kij became transmissive on the basis of a through-connect signal ("high" in the example, see FIG. 6, line s) applied at the control input s and, therefore, the crosspoint is in its through-connected condition. Then, dependent on the signal states prevailing on the two signal conductors sj′, sj″ of the associated matrix input line (column line) sj corresponding to the bit to be through-connected, the signal conductors zi′, zi″ of the matrix output line (row line) zi connected to this matrix input line (column line) sj via the associated switch element Kij will now respectively be dischaged or, will remain at the potential $U_{DD}$ assumed in the preliminary phase pv.

When the "low" signal state, as shown in line sj of FIG. 6 with a broken line prevails on a signal conductor sj′ or sj″ of the associated matrix input line (column line) sj and, accordingly, the (n-channel) pre-switch transistor Tne′ or Tne″ (FIGS. 2-4) of the associated switch element pair Kij is inhibited, then the associated signal conductor zi′ or zi″ of the matrix output line (row line) zi is not discharged via the switch element of this switch element pair Kij, but retains the potential $U_{DD}$ insofar as no other crosspoint leading to this matrix output line (row line) zi is in the through-connect condition.

When, by contrast, the "high" signal state as indicated with a solid line in the lines sj in FIG. 6 prevails on the signal conductor sj′, sj″ just now considered in the matrix input line (column line) sj this causes, the pre-switch transistor Tne′ or, respectively, Tne″ (FIGS. 2-4) of the switch element pair Kij just under consideration, as well as the switching transistor Tnk′ or, respectively, Tnk″ and the associated sampling transistor Tna to be transmissive. Then the allocated signal conductor zi′ or, respectively, zi″ of the matrix output line (row line) zi is discharged via this switch element of the switch element pair Kij and is pulled to the potential $U_{SS}$.

The respective input signal is therefore through-connected inverted via a crosspoint unblocked proceeding from its control input s.

In the exemplary embodiments set forth above with reference to FIGS. 2-4, the pre-charging transistors (Tpi′, Tpi″) are formed by p-channel transistors, whereby the p-channel pre-charging transistors (Tpi) and the sampling transistors (Tna) formed by n-channel transistors are oppositely driven by the same signal (T) as a result of their different types of channels. In a departure therefrom, however, it is also possible to realize the pre-charging transistors with n-channel transistors, so that only transistors of the same channel type are employed, i.e., the switching transistors (Tnk), the pre-switch transistors (Tne) and the sampling transistors (Tna) are also n-channel transistors. For the pre-charging transistors and sampling transistors to then again be oppositely charged with the switching matrix network selection clock at their respective control electrodes, the switching matrix network selection clock signal (T) is again directly supplied to the sampling transistors (Tna), as in the exemplary embodiments described above with reference to FIGS. 2-4, but the inverted switching matrix network selection clock signal, by contrast, is supplied to the (n-channel) pre-charging transistors.

The operation of the output amplifier circuits Ai (in FIG. 1) and having its two signal inputs zi′, zi″ (FIGS. 1 and 5) connected to the two signal conductors zi′, zi″ (FIG. 1-4) of a matrix output line as a differential amplifier having a trigger behavior, shown in FIG. 5, shall be explained below.

Let it be assumed that, as a result of a previously through-connected bit, a low signal (namely, having a signal level lying clearly under the potential $U_{DD}$) appears on the signal conductor zi′ (FIGS. 1-5) in the output amplifier circuit Ai shown in FIG. 5, and a signal $U_{DD}$ (cf. FIG. 6, line zi) appears on the signal conductor zi″. Given a clock signal according to FIG. 6, line t, having a potential $U_{DD}$ of +5 volts applied at the clock inputs t, in FIG. 5, the p-channel transistor Tpb′ of one inverter circuit in the two cross-coupled CMOS inverter circuits Tpb′, Tnb′ and Tpb″, Tnb″ interconnected to form a bistable circuit B and the n-channel transistor Tnb″ of the other inverter circuit are transmissive, and the n-channel transistor Tnb′ of the one inverter circuit and the p-channel transistor Tpb″ of the other inverter circuit are non-transmissive. Thus a potential $U_{DD}$ of +5 volts appears at the inverter output ai′ of one CMOS inverter circuit and the potential $U_{SS}$ (ground), established given transmissive transistors Tn″ and Tn′, Tnt″, Tnz″ of the selection circuit C at the junction v″ thereof (as well as at the junction vi′) with the bistable circuit B, appears at the inverter output ai″ of the other CMOS inverter circuit.

When, at the beginning of a preparatory phase for signal acceptance, the clock signal according to FIG. 6, line t, applied at the clock inputs t in FIG. 5, skips to the value $U_{SS}$ (ground), then the two isodirectionally clock signal controlled p-channel switching transistors Tp′ and Tp″ in the case of the bistable circuit B become transmissive. The potential $U_{DD}$ +5 volts is thus impressed on both inverter outputs ai′ and ai″, with the result that the respective p-channel transistor Tpb′ or Tpb″ in the two CMOS inverter circuits is non-transmissive and the respective n-channel transistor Tnb′ or Tnb″ therein is transmissive. Given a threshold voltage $U_T$ of, for example, 1 volt for the n-channel transistors Tnb′, Tnb″, a potential $U_{DD} - U_T$ of, for example, +4 volts is then established at both junctions v′ and v″ between the bistable circuit B and the selection circuit C. At least the transistors Tn″, Tn′, Tnt″ and Tnt′ are thereby non-transmissive in the selection circuit C.

The following signal acceptance phase begins with the rise of the clock signal according to FIG. 6, line t and appearing at the clock input t of FIG. 5 from the voltage value $U_{SS}$ to the voltage $U_{DD}$. During the course of the clock signal rise, the input signal applied at the input zi′ of the differential amplifier of FIG. 5 is sampled, as shown in line zi in FIG. 6.

With a rising clock signal potential, the two holding transistors Tn′ and Tn″ as well as the sampling transistors Tnt′ and Tnt″ in the selection circuit C first become transmissive; a current change causing the potentials at the junctions v′ and V″ to be lowered thereby arises at the junctions v′ and v″. The amplifier transistor Tn thereby remains initially inhibited, as long as the junctions v′ and v″ are at too high a potential and the clock signal potential is still too low, so that the cross-coupled CMOS inverters Tpb′, Tnb′ and Tpb″, Tnb″ are not yet activated to form a bistable circuit. Via the n-channel transistors Tnb′ and Tnb″ of the two CMOS inverter circuits, the currents flowing across the junctions v′ and v″ between the bistable circuit B, not yet activated as such, and the control circuit C also effect corresponding potential drops at the inverter outputs ai′ and ai″.

When the signal level $U_{DD}$, on the basis of which the input signal transistor Tnz′ of the selection circuit C is highly transmissive, is then established at this time at the amplifier input zi′ (FIG. 5), as shown in the line zi of FIG. 6 with a broken line, whereas a signal having a level lying clearly under the signal level $U_{DD}$ appears at the amplifier input zi″, then the parallel circuit composed of the transistor series circuit Tnt′, Tnz′ and the further n-channel transistor Tn′ exhibits a lower resistance than the parallel circuit composed of the further n-channel transistor Tn″ and the transistor series circuit Tnt″, Tnz″. Since the two load transistors Tpb′ and Tpb″ are driven to the same degree and are therefore transmissive to the same extent, the current flowing across the junction v′ is greater than the current across the junction v″. The drop in potential at the inverter output ai′ is therefore stronger than that at the inverter output ai″, resulting in a correspondingly stronger non-transmissivity of the driver transistor Tnb″ having its gate electrode connected to the inverter output ai′, this continuing to hold the current flowing across the junction v″ lower than the current flowing across the junction v′. Although the lower current flows across the junction v″, it should be noted that, due to the drive of the two driver transistors Tnb″ and Tnb′ proceeding from the respective other inverter output ai′ or ai″, the potential at the junction v″ decreases just as greatly as the potential at the inverter output ai′, whereas, inversely, the potential at the junction v′ follows the potential at the inverter output ai″.

When the potential at the clock signal input t exceeds the potential at the junction v″ by more than the threshold voltage of the amplifier transistor Tn, then the latter transistor becomes transmissive, whereby its drain electrode is connected to the junction v′ and its source electrode is connected to the junction v″. The result is that the majority portion of the current flowing across the junction v″, which is already lower, is drawn proceeding from the driver transistor Tnb′ and is therefore additionally superimposed on the higher current previously already flowing across the junction v′. This causes the potential at one inverter output ai′ to decrease farther, whereas the potential at the other inverter output ai″ rises again. As a result of the conductive amplifier transistor Tn, the two junctions v′ and v″ proceed to the same potential, this continuing to be drawn to the potential $U_{SS}$ (ground) by the holding transistors Tn′, Tnb″. The cross-coupled CMOS inverter circuits Tpb′, Tnb′ and Tpb″, Tnb″ are now actively interconnected to form the bistable circuit. The bistable circuit switches from its unstable condition into a stable condition, whereby the potential at the one inverter output ai′ according to FIG. 6, line ai′, proceeds to the value $U_{SS}$ (ground) and the potential at the other inverter output ai″ according to FIG. 6, line ai″, proceeds to the value $U_{DD}$ (+5 volts).

When, as shown with the solid line in FIG. 6, line zi, a signal level which is clearly below the level $U_{DD}$ is established at the amplifier input zi′ (FIG. 5) at the signal acceptance time, the input signal transistor Tnz′ of the selection circuit C is, at most, weakly conductive, whereas the input signal transistor Tnz″ is highly conductive given a signal level $U_{DD}$ appearing at the amplifier input zi″. Therefore the parallel circuit composed of the holding transistor Tn′ and the series circuit of the input signal transistor Tnz′ and the sampling transistor Tnt′ exhibits a higher resistance than the parallel circuit composed of the holding transistor Tn″ and the sampled transistor Tnt″. Then, in a manner corresponding to the mirror image of the events set forth above, a transition of the bistable circuit B is activated from its unstable condition into its other, stable condition in which, as shown with a solid line in FIG. 6, the potential $U_{DD}$ appears at the inverter output ai′ according to line ai′ in FIG. 6 and the potential $U_{SS}$ appears at the inverter output ai″ as shown in FIG. 6, line ai″.

The differential amplifier ai operable in a trigger mode was set forth above with reference to an exemplary embodiment that provides a selection circuit C between the n-channel transistors of the two CMOS inverter circuits, interconnectable to form a bistable circuit B, and the feed voltage source $U_{SS}$. In a departure therefrom, however, a selection circuit constructed with p-channel transistors can be provided between the p-channel transistors of the two CMOS inverter circuits and the feed voltage source $U_{DD}$ (FIG. 5), whereby the acceptance of an input signal is then undertaken with the decreasing clock signal edge.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a broadband signal switching matrix for use with a digital signal input circuit having a plurality of differential output pairs, a digital output circuit having a plurality of differential input pairs, a switching signal source which generates a switching signal having a period, and a voltage source having first and second terminals, said switching matrix forming a plurality of input lines each consisting of first and second signal conductors respectively connected to the outputs of an output pair of said input circuit and a plurality of output lines each consisting of first and second signal conductors respectively connected to the inputs of an input pair of said output circuit, said matrix having a plurality of crosspoints at which an input line and an output line are selectively coupleable in response to a signal from said switching signal source, the improvement comprising:

a plurality of amplifiers in said output circuit operable in a trigger mode, each amplifier being connected to said voltage source and having two inputs forming the respective input pairs of said output circuit;

a plurality of pre-charging transistors each having a controlled path connecting one of said signal conductors of an output line to said first terminal of said voltage source, and having a control electrode;

a sampling transistor having a controlled path connected to said second terminal of said voltage source and a control electrode;

selection clock means for providing clock signals to the respective control electrodes of said plurality of pre-charging transistors and to the control electrode of said sampling transistor to oppositely switch said pre-charging transistors and said sampling transistor, said clock signals each having a period coextensive with said switching signal period and divided into a pre-charge phase followed by a switching phase; and at each crosspoint of said matrix, a first switching transistor having a controlled path connected to the first signal conductor of the output line at the crosspoint, and a control electrode connected to said switching signal source;

a first auxiliary transistor having a controlled path connected in series with said controlled path of said first switching transistor and connected to said controlled path of said sampling transistor, and having a control electrode connected to the first signal conductor of the input line at the crosspoint;

a second switching transistor having a controlled path connected to the second signal conductor of the output line at the crosspoint, and control electrode connected to said switching signal source; and a second auxiliary transistor having a controlled path connected in series with said controlled path of said second switching transistor and connected to said controlled path of said sampling transistor, and having a control electrode connected to the second signal conductor of the input line at the crosspoint, said pre-charge phase of said clock signal being of a level so that, during said pre-charge phase, said sampling transistor is non-conducting and said pre-charging transistor are conducting so that said first and second signal conductors of the output line at said crosspoint are charged substantially to the voltage at said first terminal of said voltage source.

2. The improvement of claim 1, wherein:
said switching transistors, said auxiliary transistors and said sampling transistors are n-channel transistors and the pre-charging transistors are p-channel transistors.

3. The improvement of claim 1, wherein:
the switching transistors, the auxiliary transistors, the sampling transistors and the pre-charging transistors are n-channel transistors and wherein said selection clock means includes means for inverting the clock signals supplied to said respective control electrodes of said pre-charging transistors.

4. The improvement of claim 1 further comprising:
a plurality, equal to the number of crosspoints, of said sampling transistors, with one sampling transistor provided at each crosspoint.

5. The improvement of claim 1 further comprising:
a plurality, corresponding to the number of input lines, of said sampling transistors, with a signal sampling transistor connected to all second switching transistors and all second auxiliary transistors at the crosspoints of a matrix input line.

6. The improvement of claim 1 further comprising:
a plurality, corresponding to the number of output lines, of said sampling transistors, with a single sampling transistor connected to all second switching transistors and all second auxiliary transistors at the crosspoints of a matrix output line.

7. The improvement of claim 1, wherein each of said output amplifiers operable in a trigger mode comprises:
two cross-coupled complementary metal-oxide-semiconductor inverter circuits including two outputs to which said first terminal of said voltage source can be simultaneously connected via two isodirectionally clock signal-controlled transistors of said first channel type, each inverter circuit consisting of a transistor of said first channel type connected in series with a transistor of said second channel type between said first terminal of said voltage source and a junction point;

a selection circuit connected between the second terminal of said voltage source and the respective junction points of said inverter circuits, said selection circuit comprising to further transistors of the same channel type respectively connected between said junction points and said second terminal of said voltage source, and two series circuits respectively connected in parallel with said two further transistors between said junction points and said second terminal of said voltage source, each series circuit consisting of a metal-oxide-semiconductor transistor of the same channel type as said two further circuits and being controlled with the signal or the negated signal on the matrix output line connected to the amplifier, and a clock signal-controlled metal-oxide-semiconductor transistor of the same channel type as said two further transistors; and a transistor of the same channel type as said to further transistors connected between the respective junction points of the two inverter circuits, the two inverter circuit being interconnectible by said transistor connected between said junction points to form a bistable circuit.

* * * * *